United States Patent
Togami

(10) Patent No.: US 6,269,028 B1
(45) Date of Patent: Jul. 31, 2001

(54) METHOD AND APPARATUS FOR MULTISTAGE READOUT OPERATION

(75) Inventor: Tetsuji Togami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/661,631

(22) Filed: Sep. 13, 2000

(30) Foreign Application Priority Data

Sep. 24, 1999 (JP) .................................... 11-270233

(51) Int. Cl.[7] .................................................. G11C 7/00
(52) U.S. Cl. ............................... 365/189.05; 365/230.06; 365/230.08
(58) Field of Search .................. 365/189.05, 230.06, 365/230.08, 205, 207, 208

(56) References Cited

U.S. PATENT DOCUMENTS 6,011,745 * 1/2000 Okamura ......................... 365/189.05
6,014,333 * 1/2000 Mochida ......................... 365/189.05

* cited by examiner

Primary Examiner—Vu A. Le
(74) Attorney, Agent, or Firm—Darryl G. Walker

(57) ABSTRACT

According to one embodiment, a multistage readout circuit may include a smaller circuit size and/or faster circuit response. A memory cell (002) may have more than two states (VT0-VT3). Determination of a particular state can involve various stage results generated by activating a word line at different levels. A sense amplifier (003) can provide an output value at each stage. In one arrangement, a second stage value can determine if a memory cell (002) has two of four states and can be latched in a first latch circuit (041). Such a second stage value can then determine if a first stage value or third stage value is latched in a second latch circuit (042). A first/third value can determine if a memory cell (002) has one of the two states initially determined by the second stage value.

20 Claims, 5 Drawing Sheets

| | LOWER DATA | UPPER DATA | WORD LINE LEVEL | | |
|---|---|---|---|---|---|
| | | | 1st STAGE | 2nd STAGE | 3rd STAGE |
| VT0 | 0 | 0 | ON | ON | ON |
| VT1 | 0 | 1 | OFF | ON | ON |
| VT2 | 1 | 1 | OFF | OFF | ON |
| VT3 | 1 | 0 | OFF | OFF | OFF |

SELECTS φ1

SELECTS φ3

METHOD AND APPARATUS FOR MULTISTAGE READOUT OPERATION

TECHNICAL FIELD

The present invention relates generally to data readout circuits, and more particularly to a multistage readout circuit and method for a semiconductor storage device, or the like.

BACKGROUND OF THE INVENTION

Typically, semiconductor storage devices have included memory cells that can store one of two states. Thus, a circuit for reading data (a readout circuit) may compare a memory cell data signal with a reference signal. If a memory cell data signal is greater than a reference signal, the memory cell is known to store one value (e.g., a "1"). If a memory cell data signal is less than a reference signal the memory cell is known to store another value (e.g., a "0")

To achieve greater density, some semiconductor devices have included memory cells that may have more than two states. In some approaches data values may be read from a memory cell in a multistage fashion. In particular, a word line may be driven to different levels at different stages in the readout operation. At each word line level (stage) a data value may be read and latched. Latched data values may then be logically combined, by an encoder or the like, to generate an output signal.

To better understand multistage readout circuits, an example of a conventional multistage readout circuit will now be described with reference to FIGS. 8 and 9. FIG. 8 is a circuit diagram of a conventional multistage readout circuit. The circuit of FIG. 8 may read a data signal that may be at one of four levels. A multistage readout operation can encode the level into a two digit output value.

Referring now to FIG. 8, a conventional multistage readout circuit may include a readout circuit 011 that may be connected to a memory cell 012, an encoder circuit 017, and an output circuit 018. A readout circuit 011 may include a sense amplifier 013, a second stage latch circuit 141, a first stage latch circuit 142, and a third stage latch circuit 143. An encoder circuit 017 can include clocked inverters 251 and 252, as well as an inverter 241 and an exclusive OR (XOR) gate 015.

FIG. 9 illustrates a truth table representing the response of the circuit of FIG. 8. FIG. 9 shows four possible memory cell states VT0 to VT3. As but one of the many possible examples, such states (VT0 to VT3) may represent memory cell threshold voltages, with VT0 being a lowest threshold voltage and VT3 being a highest threshold voltage.

As noted above, a four state memory cell value (VT0 to VT3) may be encoded into a two digit binary value. In FIG. 9, the two digit binary value may include LOWER DATA value and an UPPER DATA value. Further, a particular state of a memory cell can be detected by driving a word line to a different level at three different stages. An output value may then be latched at each stage, with values of different stages being combined to generate output values.

FIG. 9 also shows one example of how a memory cell may respond at each stage. For example, if a memory cell had a state VT0, each stage (e.g., word line voltage level) would turn on the memory cell. Thus, the FIRST STAGE, SECOND STAGE and THIRD STAGE columns would all have the values "ON." As another example, if a memory cell has a state VT2, the memory cell would remain off for the first and second stage word line voltages. However, for a third stage word line voltage, the memory cell would turn on. Thus, the FIRST STAGE, SECOND STAGE and THIRD STAGE columns would have the values "OFF," "OFF" and "ON," respectively.

Having described the general components and response of a conventional multistage readout circuit, the operation of the circuit will now be described in conjunction with FIG. 3. FIG. 3 is a timing diagram showing various signals that may be activated in a multistage readout operation. A WORD LINE LEVEL signal shows the various levels that a word line can be driven to in determining a memory cell state. A φ2 signal can activate a second stage latch circuit 141, thereby inputting an output of a sense amplifier 013 into the second stage latch circuit 141. Similarly, φ1 and φ3 signals can activate first and third stage latch circuits 142 and 143, respectively, thereby inputting an output of a sense amplifier 013 into such latch circuit.

Two control signals, AL and BL are also shown. When control signals AL and BL are low and high, respectively, clocked inverter 252 can be active while clocked inverter 251 can be inactive. When control signals AL and BL are high and low, respectively, clocked inverter 251 can be inactive while clocked inverter 252 can be active. The alternate activation of clocked inverters 251 and 252 can provide LOWER DATA and UPPER DATA values to an output circuit 018 in a time multiplexed fashion.

FIG. 3 also includes various time periods, shown as T1 to T4, and T2'. The operation of the conventional multistage readout circuit will now be described with reference to such time periods.

At a time period T1, a word line can be driven to a second (2) of three active levels. Thus, such a time period may be conceptualized as a second stage of a multistage readout. With a word line at a level 2, a sense amplifier 013 can output a high or low level according to the particular state of a memory cell. In the response described, a level 2 word line value can result in a memory cell being ON if the memory cell has the VT0 or VT1 state, and being OFF if the memory cell has the VT2 or VT3 state. If a memory cell is ON, a sense amplifier 013 can output one value (e.g., high). Conversely, if a memory cell is OFF, a sense amplifier 013 can output another value (e.g., low).

Also during time period T1, a φ2 signal can transition low, enabling a sense amplifier output to be provided to a second stage latch circuit 141. At the same general time, control signal AL can be high and control signal BL can be low, turning on clocked inverter 251 and turning off clocked inverter 252. Thus, a value in second stage latch circuit 141 can be output to output circuit 018 while a previously encoded value output from inverter 241 can be isolated from output circuit 018 by way of clocked inverter 252. It is noted that latch circuits (141, 142 or 143) and/or output circuit 018 can invert or not invert a received input signal.

In this way, a LOWER DATA value can be provided to an output circuit 018.

At a time period T2, a word line can be driven to an inactive level (0). In the response described, a level 0 word line value can result in a memory cell being OFF regardless of the memory cell state.

Also during time period T2, a φ2 signal can transition high, and second stage latch circuit 141 can latch the second stage result of the readout operation. Control signal AL can remain high and control signal BL can remain low.

At a time period T3, a word line can be driven to a first (1) of three active levels. Thus, such a time period may be conceptualized as a first stage of a multistage readout. With a word line at a level 1, a sense amplifier 013 can output a high or low level according to the particular state of a memory cell. In the response described, a level 1 word line value can result in a memory cell being ON if the memory cell has the VT0 state, and being OFF if the memory cell has the VT1, VT2 or VT3 state.

Also during time period T3, a φ1 signal can transition low, enabling a sense amplifier output to be provided to a first stage latch circuit 142. At the same general time, control signal AL can be low and control signal BL can be high, turning off clocked inverter 251 and turning on clocked inverter 252. Thus, a value in a second stage latch circuit 141 can be isolated from output circuit 018 while the output from inverter 241 can be provided to output circuit 018.

At a time period T4, a word line can be driven to a third (3) of three active levels. Thus, such a time period may be conceptualized as a third stage of a multistage readout. With a word line at a level 3, a sense amplifier 013 can output a high or low level according to the particular state of a memory cell. In the response described, a level 3 word line value can result in a memory cell being ON if the memory cell has the VT0, VT1, or VT2 state, and being OFF if the memory cell has the VT3 state.

Also during time period T4, a φ1 signal can return high, latching a first stage value in first stage latch circuit 142. Such a value may be provided as one input to an XOR circuit 015. Further, a φ3 signal can transition low, enabling a third stage value to be input to a third stage latch circuit 143. Such a value may be provided as another input to an XOR circuit 015. Thus, at time T4, and XOR circuit 015 can output the logical XOR combination of the values latched in first and third stage latching circuits (142 and 143). The output of XOR circuit 015 can be inverted by inverter 241.

At the same general time, control signal AL can continue to be low and control signal BL can continue to be high, thus the XOR logical combination of first and third stage results can be provided to an output circuit 018 by way of clocked inverter 252.

In this way, an UPPER DATA value can be provided to an output circuit 018.

At a time period T2', a word line can return to an inactive (0) level. Also during time period T2', a φ3 signal can transition high, latching a third stage value in third stage latch circuit 143. Control signal AL can continue to be low and control signal BL can continue to be high, preventing the output of inverter 241 from being provided to output circuit 018.

One drawback to the conventional approach described can be the area that such a circuit may occupy on a semiconductor device. In particular, if such a conventional multistage readout circuit was included in a semiconductor storage device, such a readout circuit may have to be repeated numerous times. Thus, each sense amplifier can be accompanied by three latch circuits, an XOR circuit and clocked inverters.

Another drawback to the conventional approach described can be the time required for a readout operation. In particular, in a readout operation first and third stage results can be logically combined (e.g., XORed) to thereby encode the three compare results into a two bit output value.

In light of the above, it would be desirable to arrive at some way of improving the speed of a multistage readout circuit and method. In addition, or alternatively, it would be desirable to arrive at a multistage readout circuit that can occupy less area than conventional approaches.

SUMMARY OF THE INVENTION

According to the disclosed embodiments of the present invention, a multistage readout circuit may include an input node that can receive a series of stage values that can indicate one of N states, where N is greater than two. One stage value may be latched in first latch. A control circuit may selectively latch another of the stage values in a second latch according to the value in the first latch.

According to one aspect of the embodiments, a multistage readout circuit may include an encoder circuit that selectively provides the outputs of at least the first and second latch circuits as M output values, where M is less than N.

According to another aspect of the embodiments, a multistage readout circuit may include a sense amplifier that provides the stage values. The stage values may indicate whether a memory cell is turned on or off in response to different word line levels.

According to another aspect of the embodiments, a different control signal may be activated in response to each stage value. The control circuit may selectively enable a signal path between one of the control signals and the second latch according the value stored in the first latch.

According to the disclosed embodiments, a multistage readout method may include receiving a number of stage values that can indicate one of N states, where N is greater than two. The one of N states can be represented by M data values, where M is less than N. The M data values may include a lower data value and an upper data value. One first stage value may be stored as the lower data value. A second stage value may be stored as the upper data value according to the lower data value.

According to one aspect of the embodiments, receiving stage values may include receiving sense amplifier output values. Such sense amplifier output values may represent whether a memory cell is turned on or off in response to different word line levels.

According to another aspect of the embodiments, storing a second stage value may include enabling one of a number of control signal paths to a second latch according to the lower data value.

According to another aspect of the embodiments, lower and upper data values may be output sequentially.

DETAILED DESCRIPTION OF THE EMBODIMENTS

Various embodiments of the present invention will now be described to in detail with reference to a number of drawings. Particular embodiments may include a multistage readout circuit, as well as a multistage readout method.

Figure 1:
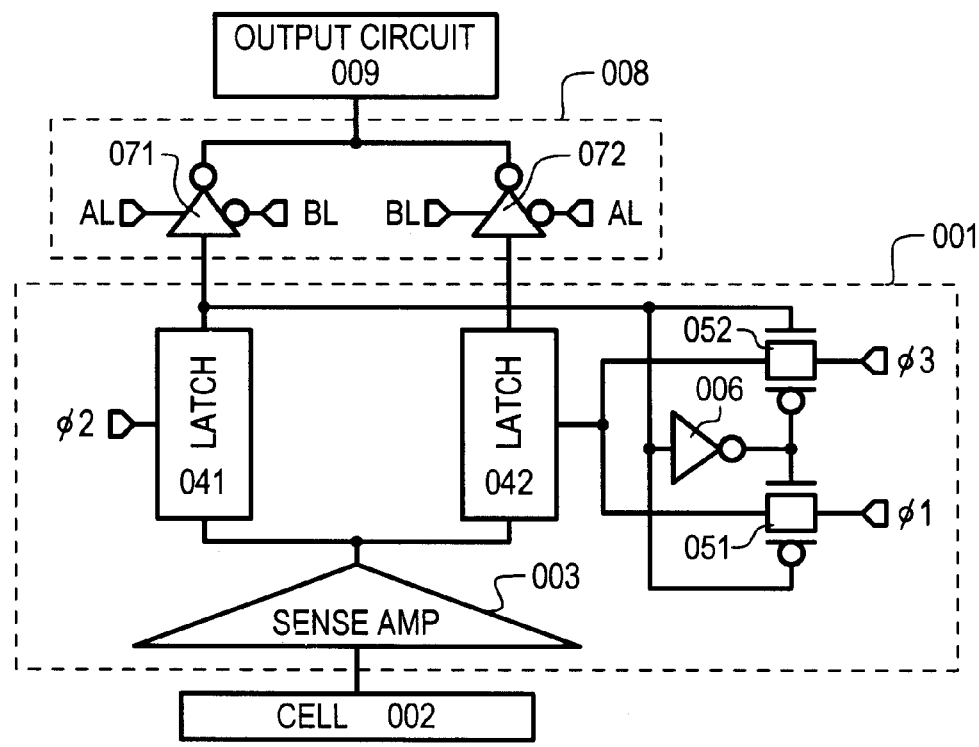
FIG. 1 is a circuit diagram of a multistage readout circuit according to a first embodiment.

Referring now to FIG. 1, a multistage readout circuit according to a first embodiment is shown in a circuit diagram. A first embodiment may receive an input value from a memory cell, for example, that may have one of four possible values. Such four possible values can be converted into a two-digit output value. Such a two-digit output value may be provided in a time multiplexed manner. In particular, a LOWER DATA value may be output followed by an UPPER DATA value.

As shown in FIG. 1, a first embodiment may include a readout circuit 001 that can be connected to a memory cell 002, an encoder circuit 008, and an output circuit 009. A readout circuit 001 may include a sense amplifier 003, a first latch circuit 041 and a second latch circuit 042. A first latch circuit 041 may latch a second stage value from sense amplifier 003 while a second latch circuit 042 may latch a first or third stage value from sense amplifier 003.

A readout circuit 001 may further include a latch control circuit. In FIG. 1, a latch control circuit may include transfer gates 051 and 052 and inverter 006. A latch control circuit may activate a second latch circuit 042 according a value latched in first latch circuit 041. More particularly, a second stage result can be used to select a first or third stage result. Even more particularly, if a first latch circuit 041 latches a second stage result that results in a low output value, transfer gate 051 can be enabled while transfer gate 052 can be disabled. In such a configuration, a φ1 signal can control the activation of the second latch circuit 042 and cause a first stage result to be input to the second latch circuit 042. Conversely, if a first latch circuit 041 latches a second stage result that results in a high output value, transfer gate 052 can be enabled while transfer gate 051 can be disabled. In such a configuration, a φ3 signal can control the activation of the second latch circuit 042 and cause a third stage result to be input into a second latch circuit 042.

In the latch control circuit of FIG. 1, transfer gates 051 and 052 may comprise complementary metal-oxide-semiconductor (CMOS) type transfer gates that receive the output of first latch circuit 041 either directly, or by way of an inverter 006. Transfer gate 051 may receive a φ1 signal as an input, and include an n-channel transistor having a gate connected to the output of inverter 006 and a p-channel transistor having a gate connected to the output of first latch 041. Transfer gate 052 may receive a φ3 signal as an input, and include a p-channel transistor having a gate connected to the output of inverter 006 and an n-channel transistor having a gate connected to the output of first latch 041.

An encoder circuit 008 may include a first clocked inverter 071 between the output of the first latch circuit 041 and an output circuit 009. In addition, a second clocked inverter 072 can be situated between the output of the second latch circuit 042 and the output circuit 009. Alternate activation of clocked inverters (071 and 072) can enable the time multiplexing of a LOWER DATA value and an UPPER DATA value. In the example of FIG. 1, clocked inverters (071 and 072) can be activated by control signals AL and BL, which can be complementary to one another.

Of course, while the particular encoder circuit 008 includes first and second clocked inverters (071 and 072) other arrangements may include alternate circuits for selectively connecting first and second latch circuits (041 and 042) to an output circuit 009. As but one example, an encoder circuit 008 may include transfer transistors for such an operation.

It is noted that a first embodiment may include two latch circuits and a latch control circuit. This is in contrast to the previously described conventional example that can include three latch circuits. In this way, the size of a multistage readout circuit according to one embodiment may be smaller than conventional approaches.

Further size reductions may be achieved in an encoder circuit. An encoder circuit according to the first embodiment may include two clocked inverter circuits. This is in contrast to the previously described conventional example that can include two clocked inverter circuits, an inverter and an XOR circuit.

Of course, while advantages in size reduction have been described for a four state memory cell, approaches that can read memory cells having more states may also benefit. As but one particular example, in an eight state version, a multistage readout circuit may receive values as a word line steps through seven different levels. In such a case, a multistage readout circuit according to the present invention may have reduced number of latch circuits and a more simplified encoder circuit, as compared to conventional approaches. One particular example of a such an approach will be described as a second embodiment.

Figure 2:
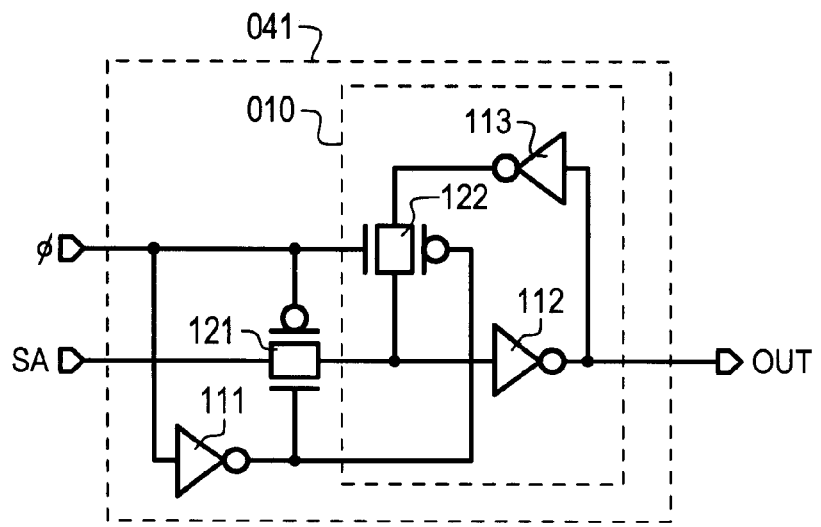
FIG. 2 is a circuit diagram of a latch circuit according to an embodiment.

As described above, a readout circuit 001 may include first and second latch circuits 041 and 042. One example of a latch circuit that may be utilized as a first and/or second latch circuit is shown in FIG. 2. In one particular approach, latch circuits 041 and 042 can have the same structure, but receive different timing signals (e.g., first latch circuit 041 may receive a φ2 signal, while a second latch circuit 042 may receive either a φ1 or φ3 signal).

Referring now to FIG. 2, a latch circuit 041 may receive an input value SA and a timing signal φ. An input value SA may be the output of a sense amplifier and a timing signal φ may be a signal that is activated to input a particular stage result, such as φ1, φ2 or φ3. A latch circuit may include an input transfer gate 121, a control inverter 111 and a latch portion 010.

In the particular example of FIG. 2, an input transfer gate 121 may be a CMOS-type transfer gate that receives input value SA, and include an n-channel transistor having a gate connected to the output of inverter 111 and a p-channel transistor having a gate that receives a timing signal φ. A latch portion 010 may include latch transfer gate 122 and cross-coupled inverters 112 and 113. Latch transfer gate 122 may have an input connected to the output of inverter 113 and an output connected to the output of input transfer gate 121. Inverter 112 may receive an input from input transfer gate 121 and provide an output to inverter 113, which can also be an output value OUT.

Figures 3, 4:
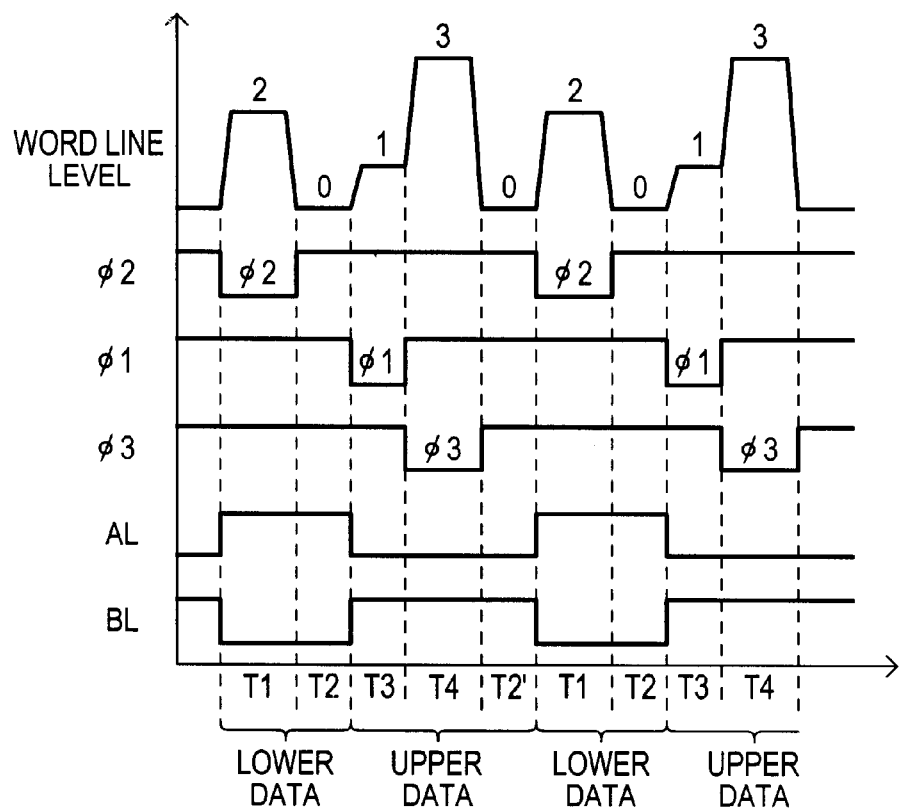
FIG. 3 is a timing diagram illustrating the operation of a multistage readout circuit.
FIG. 4 is a truth table illustrating the operation of a first embodiment.

Having described various circuits according to a first embodiment, the operation of the first embodiment of FIG. 1 will now be described with reference to FIGS. 3 and 4. FIG. 3 is a timing diagram previously described with reference to the conventional multistage readout circuit of FIG. 8.

FIG. 4 shows a truth table representing the response of the circuit of FIG. 1. FIG. 4 shows four possible memory cell states VT0 to VT3. As but one of the many possible examples, such states (VT0 to VT3) may represent memory cell threshold voltages, with VT0 being a lowest threshold voltage and VT3 being a highest threshold voltage.

A four state memory cell value (VT0 to VT3) may be sensed and encoded into a two digit binary value. A two digit binary value may include a LOWER DATA value and an UPPER DATA value. Further, a particular state of a memory cell can be detected by driving a word line to a different level at three different stages. Two of three output values may be latched at each stage to thereby generate a LOWER DATA value and UPPER DATA value.

Figures 8, 9:
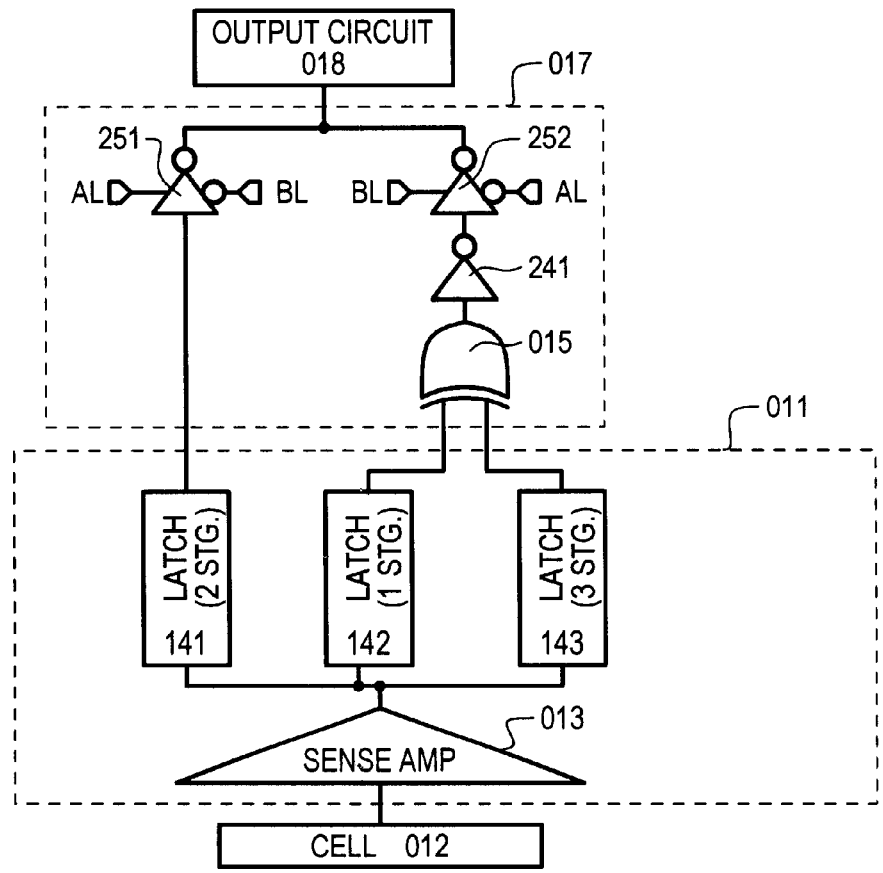
FIG. 8 is a circuit diagram of a conventional multistage readout circuit.
FIG. 9 is a truth table illustrating the operation of the circuit of FIG. 8.

FIG. 4, like FIG. 9, shows one example of how a memory cell may respond at each stage. For example, if a memory cell had a state VT0, each stage (e.g., word line voltage level) would turn the memory cell on. Thus, the FIRST STAGE, SECOND STAGE and THIRD STAGE columns would all have the values "ON." As another example, if a memory cell has a state VT2, the memory cell would remain off for the first and second stage word line voltages. However, for a third stage word line voltage, the memory cell would turn on. Thus, the FIRST STAGE, SECOND STAGE and THIRD STAGE columns would have the values "OFF," "OFF," and "ON," respectively.

Referring now to FIGS. 1 to 3, at a time period T1, a word line can be driven to a second (2) of three active levels. Such an operation can essentially determine if memory cell has two of four possible states. In the particular case of FIGS. 1 to 3, a sense amplifier output at time T1 may indicate if a memory cell is ON or OFF. If a memory cell is ON, a memory cell may have a VT0 or VT1 state. However, if a memory cell is OFF, a memory cell may have a VT2 or VT3 state. In this way, a second stage result may be generated.

During time period T1, a $\phi 2$ signal can be low, enabling a sense amplifier output to be provided to first latch circuit 041. At the same general time, control signal AL can be high and control signal BL can be low, turning on clocked inverter 071 and turning off clocked inverter 072. Thus, a value in a first latch circuit 041 can be provided to output circuit 009 while a value previously latched in second latch 042 can be isolated from output circuit 009 by way of clocked inverter 072.

In this way, a LOWER DATA value can be provided to an output circuit 009.

At a time period T2, a word line can be driven to an inactive (0) level. In the response described, a level 0 word line value can result in a memory cell being OFF regardless of the memory cell state.

Also during time period T2, a $\phi 2$ signal can transition high. With a $\phi 2$ signal high, a first latch circuit 041 can latch the a second stage result. Control signal AL can remain high and control signal BL can remain low during this time period.

It is noted that a second stage result stored in a first latch circuit 041 can control which signal ($\phi 1$ or $\phi 3$) is received by a second latch circuit 042. In this way, one stage result (e.g., a second stage result) can control which of a number of other stage results (e.g., first or third stage result) are latched and then output.

At a time period T3, a word line can be driven to a first (1) of three active levels. In conjunction with a previous second stage result, such an operation may determine if memory cell has one of two states. More particularly, if a second stage result (the value latched in a first latch 041) indicates that a memory cell may have a VT0 or VT1 state, a first stage result (the output of sense amplifier 003 when the word line is at a 1 level) can determine which of the two states (VT0 or VT1) the memory cell is in. In the example of FIGS. 1–4, if a sense amplifier indicates a memory cell is ON, a memory cell can have a VT0 state. However, if a memory cell is OFF, a memory cell can have a VT1 state.

It will be recalled that if a second stage result indicates that a memory cell has a VT0 or VT1 state, an output from first latch circuit 041 can result in a $\phi 1$ signal controlling a second latch circuit 042. As shown in FIG. 3, during time period T3 a $\phi 1$ signal can be low. In this way, if a first stage result is needed to determine a memory cell state, such a first stage result can be input to a second latch circuit 042 by operation of the $\phi 1$ signal. In contrast, if a second stage result has determined that a first stage result is not needed to determine a memory cell state (i.e., the memory cell is in the VT2 or VT3 state), the output of first latch circuit 041 can be high, preventing a $\phi 1$ signal from controlling the second latch circuit 042.

At the same general time, control signal AL can be low and control signal BL can be high, turning off clocked inverter 071 and turning on clocked inverter 072. Thus, a value in a first latch circuit 041 can be isolated from output circuit 009 while the output from second latch circuit 042 can be provided to output circuit 009.

In this way, a second stage result can be used to provide a LOWER DATA value for an output circuit 009. At the same time, the same second stage result can determine if a first or third stage result will be latched to provide an UPPER DATA value.

At a time period T4, a word line can be driven to a third (3) of three active levels. In conjunction with a previous second stage result, such an operation may determine if memory cell has one of two states. More particularly, if a second stage result indicates that a memory cell may have a VT2 or VT3 state, a third stage result (the output of sense amplifier 003 when the word line is at a level 3) can determine which of the two states (VT2 or VT3) the memory cell is in. In the example of FIGS. 1–4, if a sense amplifier indicates a memory cell is ON, a memory cell can have a VT2 state. However, if a memory cell is OFF, a memory cell can have a VT3 state.

It will be recalled that if a second stage result indicates that a memory cell has a VT2 or VT3 state, an output from first latch circuit 041 can result in a $\phi 3$ signal controlling a second latch circuit 042. As shown in FIG. 3, during time period T4, a $\phi 3$ signal can be low. In this way, if a third stage result is needed to determine a memory cell state, such a third stage result can be input to a second latch circuit 042 by operation of the $\phi 3$ signal.

Also during time period T4, control signal AL can continue to be low and control signal BL can continue to be high, connecting the output of a second latch circuit 042 to output circuit 009.

In this way, an UPPER DATA value can be provided to an output circuit 009.

At a time period T2', a word line can return to an inactive (0) level. Control signal AL can continue to be low and control signal BL can continue to be high, preventing the output of first latch circuit 041 from being provided to output circuit 009.

Having described the operation of a multistage readout circuit according to FIG. 1, the operation of a latch circuit according to FIG. 2 will now be described.

When a timing signal $\phi$ is low, a low value may be applied to the gate of the p-channel transistor in input transfer gate 121, while a high value may be applied to the gate of the n-channel transistor in input transfer gate 121 by operation of inverter 111. In this way input transfer gate 121 can be turned on, allowing input value SA to be applied to the input of inverter 112 within latch portion 010. Inverter 112 can invert the input value SA to generate an output value OUT. In this way, a latch may input a value SA. Further, with a timing signal $\phi$ low, a low value may be applied to the gate of the n-channel transistor in latch transfer gate 122, while a high value may be applied to the gate of the p-channel transistor in latch transfer gate 122 by operation of inverter 111. In this way latch transfer gate 122 can be turned off, preventing the input value SA from being latched by cross-coupled inverters 112 and 113.

When a timing signal φ is high, a high value may be applied to the gate of the p-channel transistor in input transfer gate 121, while a low value may be applied to the gate of the n-channel transistor in input transfer gate 121. In this way input transfer gate 121 can be turned off, preventing subsequent changes in the input signal SA from affecting the output value OUT. With a timing signal φ high, a high value may be applied to the gate of the n-channel transistor in latch transfer gate 122, while a low value may be applied to the gate of the p-channel transistor in latch transfer gate 122. In this way, a latch transfer gate 122 can be turned on, thereby latching a data value in latch portion 010.

The embodiments described above have illustrated a multistage readout circuit that may include two latch circuits per amplifier. This can provide a smaller overall semiconductor device than approaches that may include a larger number of latch circuits. Such a reduction in latch circuit numbers can be achieved by latching a lower data value, and then using the lower data value to determine which of a number of stage results to provide as an upper data value.

The embodiments described above have also illustrated a multistage readout circuit that may have an encoder circuit with two clocked inverters. This can provide a smaller overall semiconductor device than approaches that may include more complex encoder circuits. Such a reduction in encoder circuit size can be achieved, as the logical combination of two latched values (e.g., first and third stage results) does not necessarily have to occur.

Still further, because an encoder circuit according to the present invention may have fewer logical operations than a conventional approach, a faster readout operation can result.

The above embodiments have includes a multistage readout circuit that may access a four state memory cell. However, such a particular application should not be construed as limiting the invention thereto. As but one example, multistage readout circuits may access a memory cell having a larger number of states. To illustrate such a larger state case, a second embodiment will now be described.

Figure 5:
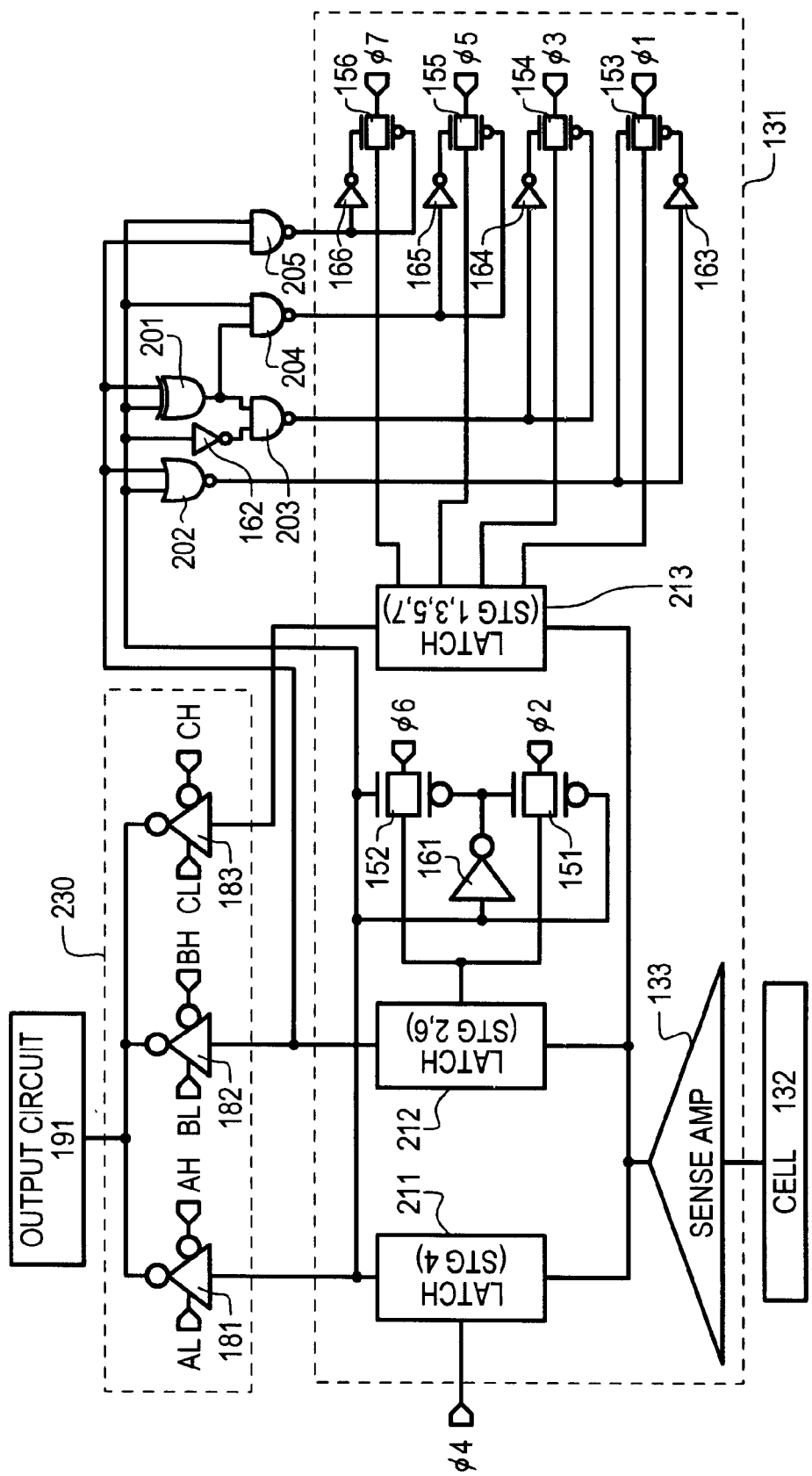
FIG. 5 is a circuit diagram of a multistage readout circuit according to a second embodiment.
Figures 6, 7:
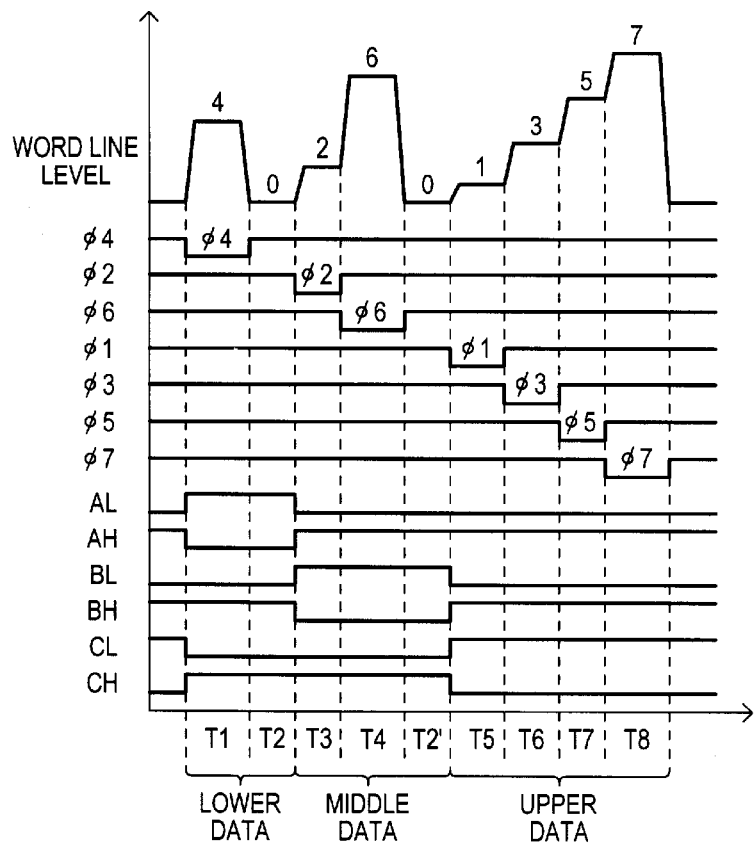
FIG. 6 is a timing diagram illustrating the operation of the multistage readout circuit of FIG. 5.
FIG. 7 is a truth table illustrating the operation of a second embodiment.

Referring now to FIGS. 5–7, a multistage readout circuit according to a second embodiment is shown in a circuit diagram. A second embodiment may receive a input value from a memory cell, for example, that may have one of eight possible values. Such eight possible values can be converted into a three-digit output value. Such a three-digit output value may be provided in a time multiplexed manner. In particular, a LOWER DATA value may be followed by a MIDDLE DATA value. The MIDDLE DATA value may then be followed by an UPPER DATA value.

In the example of FIGS. 5–7, one of eight states may be determined in a series of readout operations. In particular, a word line may be driven between seven active states to generate first through seven stage values. Such values may be selectively latched to generate LOWER DATA, MIDDLE DATA and UPPER DATA values.

As shown in FIG. 5, a second embodiment may include a readout circuit 131 that may be connected to a memory cell 132, an encoder circuit 230, and an output circuit 191. A readout circuit 131 may include a sense amplifier 133, a first latch circuit 211, a second latch circuit 212, and a third latch circuit 213. A first latch circuit 211 may latch a fourth stage value. A second latch circuit 212 may latch a second or sixth stage value, depending upon the output of a first latch circuit 211. A third latch circuit 213 may output a first, third, fifth, or seventh stage value, depending upon the outputs of the first and second latch circuits (211 and 212).

A readout circuit 131 may further include a latch control circuit. A latch control circuit may control which particular stage values are latched within a second latch 212 and a third latch 213. In particular, a latch control circuit can determine whether a second latch 212 latches a second stage value or sixth stage value, and whether a third latch 213 latches a first, third, fifth or seventh stage value.

A latch control circuit may be conceptualized as including a second latch control circuit and a third latch control circuit. A second latch control circuit can determine which of two stage control signals (φ2 or φ6) can be provided to a second latch circuit 212. In FIG. 5, a second latch control circuit includes inverter 161, transfer gate 151, and transfer gate 152. transfer gate 151 can supply a 42 signal to a second latch circuit 212. Transfer gate 152 can supply a φ6 signal to a second latch circuit 212. The output of first latch circuit 211, in conjunction with inverter 161 can enable either transfer gate 151 or 152.

A third latch control circuit can determine which of four stage control signals (φ1, φ3, φ5, or φ7) can be provided to a third latch circuit 213. In FIG. 5, a third latch control circuit may include transfer gates 153, 154, 155, and 156, and inverters 163, 164, 165, and 166. Transfer gates 153, 154, 155, and 156 can supply signals φ1, φ3, φ5, and φ7, respectively, to a third latch circuit 213. The outputs of first and second latch circuits 211 and 212 in conjunction with decoder circuits can enable one of the transfer gates 153, 154, 155, or 156.

The present invention may further include decode circuits, including XOR gate 201, NOR gate 202, NAND gates 203, 204, 205, and inverter 162. Decode circuits can decode the various combinations of output values from first and second latch circuits (211 and 212) to thereby select a particular control signal (φ1, φ3, φ5, or φ7) for a third latch circuit 213.

In FIG. 5, particular combinations of outputs from first and second latch circuit (211 and 212) can enable particular transfer gates (153, 154, 155, and 156). More particularly, when the outputs of first and second latch circuits (211 and 212) are both low, the output of NOR gate 202 will go high, enabling transfer gate 153 and thereby allowing control signal φ1 to activate a third latch circuit 213. At the same time, the output of XOR gate 201 can go low forcing the outputs of NAND gates 203 and 204 both high. In this way, transfer gates 154 and 155 can both be turned off. Similarly, the low inputs to NAND gate 205 cause the output of NAND gate 205 to be high, turning off transfer gate 156.

When the output of first latch circuit 211 is low and the output of second latch circuit 212 is high, the output of NOR gate 202 will go low, turning off transfer gate 153. At the same time, the output of XOR gate 201 can go high providing one high input to NAND gates 203 and 204. Because the output of first latch circuit 211 is low, inverter 162 can provide a second high input to NAND gate 203, and the output of NAND gate 203 can go low, turning on transfer gate 154 while the output of NAND gate 204 can go high turning off transfer gate 155. In this way, control signal φ3 can activate a third latch circuit 213. With the output of first latch circuit 211 low, the output of NAND gate 205 can be driven high, turning off transfer gate 156.

When the output of first latch circuit 211 is high and the output of second latch circuit 212 is low, the output of NOR gate 202 will go low, turning off transfer gate 153. At the same time, the output of XOR gate 201 can go high providing one high input to NAND gates 203 and 204. Because the output of first latch circuit 211 is high, inverter 162 can provide a low input to NAND gate 203 and the output of NAND gate 203 can be high, turning off transfer gate 154. The high output from first latch circuit 211 can result in two high inputs to NAND gate 204, and the output of NAND gate 204 can go low turning on transfer gate 155. In this way, control signal 45 can activate a third latch circuit 213. With the output of second latch circuit 212 low, the output of NAND gate 205 can be driven high, turning off transfer gate 156.

When the outputs of first and second latch circuits (211 and 212) are both high, output of NOR gate 202 will go low, turning off transfer gate 153. At the same time, the output of XOR gate 201 can go low forcing the outputs of NAND gates 203 and 204 both high. In this way, transfer gates 154 and 155 can both be turned off. With both outputs of first and second latch circuits (211 and 212) high, the output of NAND gate 205 can be driven low, turning on transfer gate 156. In this way, control signal φ7 can activate a third latch circuit 213.

An encoder circuit 230 may include three clocked inverters 181, 182, and 183. Clocked inverter 181 may provide a LOWER DATA value to output circuit 191. Clocked inverter 182 may provide a MIDDLE DATA value to output circuit 191. Clocked inverter 183 may provide an UPPER DATA value to output circuit 191.

Having described various circuits according to a second embodiment, the operation of the second embodiment of FIG. 5 will now be described with reference to FIGS. 6 and 7. FIG. 6 is a timing diagram showing various signals that may be activated in a multistage readout operation. A WORD LEVEL signal shows the various levels that a word line can be driven to in determining a memory cell state. A φ4 signal can activate a first latch circuit 211, thereby inputting a fourth stage result to first latch circuit 211. Similarly, a φ2 or φ6 signal can activate a second latch circuit 212, thereby inputting a second or sixth stage result to second latch circuit 212. Still further, a φ1, φ3, φ5, or φ7 signal can activate a third latch circuit 213, thereby inputting a first, third, fifth, or seventh stage result to third latch circuit 213.

Three control signal pairs are also shown as AL/AH, BL/BH and CL/CH. When control signal pair AL/AH are high and low, respectively, clocked inverter 181 can be active. When control signal pair BL/BH are high and low, respectively, clocked inverter 182 can be active. When control signal pair CL/CH are high and low, respectively, clocked inverter 183 can be active. The sequential activation of clocked inverters 181, 182 and 183 can provide LOWER DATA, MIDDLE DATA and UPPER DATA values to an output circuit 009 in a time multiplexed fashion.

FIG. 6 also includes various time periods, shown as T1 to T8 and T2'. The operation of the second embodiment will be described with reference to such time periods below. FIG. 7 shows a truth table representing the response of the circuit of FIG. 5. FIG. 7 shows eight possible memory cell states VT0 to VT7. As but one of the many possible examples, such states (VT0 to VT7) may represent memory cell threshold voltages, with VT0 being a lowest threshold voltage and VT7 being a highest threshold voltage.

An eight state memory cell value (VT0 to VT7) may be sensed and encoded into a three digit binary value. A three digit binary value may include LOWER DATA, MIDDLE DATA, and UPPER DATA values. Further, a particular state of a memory cell can be detected by driving a word line to a different level at seven different stages. Three of seven output values may be latched to thereby generate the LOWER DATA, MIDDLE DATA and UPPER DATA values.

FIG. 7 shows one example of how a memory cell may respond at each stage of a multistage readout operation. For example, if a memory cell had a state VT0, each stage (e.g., word line voltage level) would turn on the memory cell. Thus, the 1st through $7^{th}$ columns would all have the values "ON." As another example, if a memory cell has a state VT4, the memory cell would remain off for the first through fourth stages. However, for the fifth through seventh stage, memory cell would turn on. Thus, the $1^{th}$ through $4^{th}$ columns would have the value "OFF" while the $5^{th}$ through $7^{th}$ columns would have the value "ON."

Referring now to FIGS. 5 to 7, at a time period T1, a word line can be driven to a fourth (4) of seven active levels. Such an operation can essentially determine if memory cell has four of eight states. In the particular case of FIGS. 5 to 7, a sense amplifier may output a value that indicates if a memory cell is ON or OFF. If a memory cell is ON, a memory cell may have a state in the range of VT0 to VT3. However, if a memory cell is OFF, a memory cell may have a state in the range of VT4 to VT7. In this way, a fourth stage result may be generated.

During time period T1, a φ4 signal can be low, enabling a sense amplifier output to be provided to first latch circuit 211. At the same general time, control signal pair AL/AH can turn on clocked inverter 181, while control signal pairs BL/BH and CL/CH can turn off clocked inverters 182 and 183. Thus, a value in a first latch circuit 211 can be provided to output circuit 191 while values previously latched in second latch circuit 212 and third latch circuit 213 can be isolated from output circuit 191 by way of clocked inverters 182 and 183.

In this way, a LOWER DATA value can be provided to an output circuit 191.

At a time period T2, a word line can be driven to an inactive (0) level. In the response described, a level 0 word line value can result in a memory cell being OFF regardless of the memory cell state.

Also during time period T2, a φ4 signal can transition high. With a φ4 signal high, a first latch circuit 211 can latch a fourth stage result. Control signal pairs AL/AH, BL/BH and CL/CH can continue to enable clocked inverter 181 and disable clocked inverters 182 and 183.

It is noted that the fourth stage result stored in a first latch circuit 211 can control which signal (φ2 or φ6) will be provided to the second latch circuit 212. In this way, one stage result (e.g., a fourth stage result) can control which of a number of other stage results (e.g., second or sixth stage result) are latched and then output. Looked at in another way, a fourth stage result can indicate whether second stage result or a sixth stage result is needed to further narrow down a memory cell state in a readout operation.

At a time period T3, a word line can be driven to a second (2) of seven active levels. In conjunction with a previous fourth stage result, such an operation may determine if memory cell has one of two states. More particularly, if a fourth stage result (the value in a first latch 211) indicates that a memory cell may have a state in the range of VT0 to VT3, a first second result (the output of sense amplifier 133 when the word line is at a level 2) can further narrow down the possible values to two states. In the example of FIGS.

5–7, if a sense amplifier in the second stage indicates a memory cell is ON, a memory cell can have a VT0 or VT1 state. However, if a memory cell is OFF, a memory cell can have a VT2 or VT3 state.

It will be recalled that if a fourth stage result indicates that a memory cell has a VT0 to VT3 state, an output from first latch circuit 211 can result in a φ2 signal controlling a second latch circuit 212. As shown in FIG. 6, during time period T3 a φ2 signal can be low. In this way, if a second stage result is needed to further narrow down a memory cell state, such a second stage result can be input to a second latch circuit 212 by operation of the φ2 signal.

At the same general time, control signal pair BL/BH can turn on clocked inverter 182 while control signal pair AL/AH turns off clocked inverter 181. Thus, a value in a second latch circuit 212 can be provided to output circuit 191. Control signal pair CL/CH can continue to keep clocked inverter 183 turned off.

In this way, a fourth stage result can be used to provide a LOWER DATA value for an output circuit 009. At the same time, the same fourth stage result can determine if a second or sixth stage result will be latched to provide a MIDDLE DATA value.

At a time period T4, a word line can be driven to a sixth (6) of seven active levels. In conjunction with a previous fourth stage result, such an operation may determine if memory cell has one of two states. More particularly, if a fourth stage result (the value in a first latch 211) indicates that a memory cell may have a state in the range of VT4 to VT7, a sixth stage result (the output of sense amplifier 133 when the word line is at a level 6) can further narrow down the possible values to two states. In the example of FIGS. 5–7, if a sense amplifier in the second stage indicates a memory cell is ON, a memory cell can have a VT4 or VT5 state. However, if a memory cell is OFF, a memory cell can have a VT6 or VT7 state.

It will be recalled that if a fourth stage result indicates that a memory cell has a VT4 to VT7 state, an output from first latch circuit 211 can result in a φ6 signal controlling a second latch circuit 212. As shown in FIG. 6, during time period T4 a φ6 signal can be low. In this way, if a sixth stage result is needed to further narrow down a memory cell state, such a sixth stage result can be input to a second latch circuit 212 by operation of the φ6 signal.

At the same general time, control signal pairs AL/AH, BL/BH and CL/CH keep clocked inverters 181 and 183 off, and clocked inverter 182 on. Further, a φ2 signal is high.

At a time period T2', a word line can return again to an inactive (0) level. Also during time period T2', a φ6 signal can transition high. With φ2 and φ6 signals both high, a second latch circuit 212 can latch either a second or sixth stage result, depending upon the value latched in the first latch circuit 211. Control signal pairs AL/AH, BL/BH and CL/CH can continue to enable clocked inverter 182 and disable clocked inverters 181 and 183.

In this way, a MIDDLE DATA value can be provided to an output circuit 191.

It is noted that a second or sixth stage result stored in a second latch circuit 212, in combination with the fourth stage result latched in a first latch circuit 211, can control which signal (φ1, φ3, φ5 or φ7) will be provided to the third latch circuit 213. In this way, previous stage results (e.g., a fourth stage result and either a second or sixth stage result) can control which of a number of other stage results (e.g., first, third, fifth or seventh stage result) are latched and then output. Looked at in another way, a fourth and second/sixth stage results can indicate which of the first, third, fifth or seventh stage results is needed to finally determine a memory cell state.

At a time period T5, a word line can be driven to a first (1) of seven active levels. In conjunction with previous fourth and second/sixth stage results, such an operation may determine if memory cell has one of two states. More particularly, if fourth and second stage results indicate that a memory cell may have a VT0 or VT1 state, a first stage result (the output of sense amplifier 133 when the word line is at a level 1) can determine which of the two states (VT0 or VT1) the memory cell is in. In the example of FIGS. 5–7, if a sense amplifier indicates a memory cell is ON, a memory cell can have a VT0 state. However, if a memory cell is OFF, a memory cell can have a VT1 state.

It is noted that if a fourth and second/sixth stage results indicates that a memory cell has a VT0 or VT1 state, outputs from first and second latch circuits (211 and 212) can result in a φ1 signal controlling a third latch circuit 213. As shown in FIG. 6, during time period T5 a φ1 signal can be low. In this way, if a first stage result is needed to determine a memory cell state, such a first stage result can be input to a third latch circuit 212 by operation of the φ1 signal.

At a time period T6, a word line can be driven to a third (3) of seven active levels. In conjunction with previous fourth and second/sixth stage results, such an operation may determine if memory cell has one of two states. More particularly, if fourth and second stage results indicate that a memory cell may have a VT2 or VT3 state, a third stage result (the output of sense amplifier 133 when the word line is at a level 3) can determine which of the two states (VT2 or VT3) the memory cell is in. In the example of FIGS. 5–7, if a sense amplifier indicates a memory cell is ON, a memory cell can have a VT2 state. However, if a memory cell is OFF, a memory cell can have a VT3 state.

As in the first stage case, if fourth and second/sixth stage results indicate that a memory cell has a VT2 or VT3 state, outputs from first and second latch circuits (211 and 212) can result in a φ3 signal controlling a third latch circuit 213. As shown in FIG. 6, during time period T6 a φ3 signal can be low. In this way, if a third stage result is needed to determine a memory cell state, such a third stage result can be input to a third latch circuit 212 by operation of the φ3 signal.

Time periods T7 and T8 have operations similar to those of times T5 and T6. However, during time period T7, a fifth stage value can be input to a third latch circuit 213 if such a value is needed to distinguish between the VT4 and VT5 states. Similarly, during time period T8, a seventh stage value can be input to a third latch circuit 213 if such a value is needed to distinguish between the VT6 and VT7 states.

As shown in FIG. 6, during time periods T5 to T8, control signal pairs AL/AH, BL/BH and CL/CH can turn clocked inverters 181 and 182 off, and clocked inverter 183 on.

At time T8, a third latch circuit will store either a first, third, fifth, or seventh stage result that may be output by way of clocked inverter 183. In this way, an UPPER DATA value may be provided to an output circuit 191.

The second embodiments described above have illustrated an eight value multistage readout circuit that may include three latch circuits per amplifier. This can provide a smaller overall semiconductor device than approaches that may include a larger number of latch circuits.

The second embodiment described above has also illustrated an eight value multistage readout circuit that may include an encoding circuit that includes only three clocked inverters. Such an arrangement can also provide a smaller and/or faster semiconductor device than conventional approaches.

Various multistage readout circuits and methods have been described. Such methods have shown how N values (where N is a number greater than 3) can be classified into at least a lower data value and a higher data value. The N values may be judged (by a sense amplifier or like) at various times (by activation of a word line, for example). A lower data value can be used to determine when a judged value is stored to provide an upper data value. Such an approach can result in a circuit that stores less than N values when classifying such values. This can result in smaller circuit size and/or faster circuit speed.

While the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A multistage readout circuit, comprising:
   an input node that can provide a series of stage values that indicate one of N states, where N is at least three;
   less than N storage circuits that provide an output value that identifies the one of N states, the output value including a lower data value provided by storing one of the stage values and a higher data value; and
   a control circuit that controls which of the different stage values is stored in the N storage circuits as the higher data value according to the lower data value.

2. The multistage readout circuit of claim 1, further including:
   an encoder circuit that selects and outputs the lower and higher data values.

3. The multistage readout circuit of claim 2, wherein:
   the encoder circuit includes signal paths having at least one circuit selected from the group consisting of a clocked logic circuit and a transfer transistor.

4. The multistage readout circuit of claim 1, further including:
   a sense amplifier circuit having an output coupled to the input node.

5. The multistage readout circuit of claim 4, wherein:
   the sense amplifier output provides stage values that indicate the response of a memory cell to different word line levels.

6. The multistage readout circuit of claim 1, further including:
   a plurality of control signals, each control signal being coincident with a different stage value; and
   the control circuit selectively provides one of the control signals to one of the latch circuits according to the lower data value.

7. The multistage readout circuit of claim 1, wherein:
   the number of storage circuits is greater than two and the output value includes a first lower data value provided by storing a first stage value and a second lower data value provided by selectively storing a second stage value according to the first lower data value; and
   the control circuit that controls which of the different stage values is stored as the higher data value according to the first and second lower data values.

8. A multistage readout circuit, comprising:
   a first latch circuit that stores a first of a plurality of stage values that can indicate one of N states, where N is greater than two;
   a second latch circuit that can receive a second of the plurality of stage values when activated; and
   a control circuit that receives the output of the first latch circuit and activates the second latch.

9. The multistage readout circuit of claim 8, wherein:
   the second latch includes a control signal input, and is activated when the control signal input receives an active control signal; and
   the control circuit selectively couples one of a plurality of control signals to the control signal input.

10. The multistage readout circuit of claim 9, wherein:
    the control circuit includes a signal path between the control signal input of the second latch and each control signal, the control circuit enabling one of the signal paths according to the output of the first latch circuit.

11. The multistage readout circuit of claim 8, wherein:
    each stage value indicates the response of at least one data storage cell to a different input value level.

12. The multistage readout circuit of claim 11, wherein:
    each stage value indicates whether the at least one data storage cell is turned on or off in response to different word line level.

13. The multistage readout circuit of claim 8, further including:
    a third latch circuit that can receive a third of the plurality of stage values when activated; and
    the control circuit further receives the output of the second latch circuit and activates the third latch circuit.

14. A multistage readout method, comprising the steps of:
    providing a plurality of stage values that can indicate one of N states, where N is greater than 2;
    representing the one of N states as M data values, where M is less than N, the M data values including a lower data value and an upper data value;
    holding a first of the plurality of stage values as the lower data value; and
    selecting a second of the plurality of stage values as the upper data value according to the lower data value.

15. The multistage readout method of claim 14, wherein:
    providing a plurality of stage values includes receiving a plurality of sense amplifier outputs that correspond to a circuit cell response to a different input level.

16. The multistage readout method of claim 15, wherein:
    providing a plurality of stage values includes determining if a memory cell is on or off in response to different word line levels.

17. The multistage readout method of claim 14, wherein:
    holding a first of the plurality of stage values includes inputting a first stage value in response to a first control signal.

18. The multistage readout method of claim 14, wherein:
    selecting a second of the plurality of stage values includes inputting a second stage value in response to one of a plurality of control signals selected by the first stage value.

19. The multistage readout method of claim 14, further including:
    sequentially outputting the upper and lower data values.

20. The multistage readout method of claim 19, wherein:
    sequentially outputting the upper and lower data values includes enabling a second signal path between a second latch and an output node after enabling a first signal path between a first latch and the output node.

* * * * *